United States Patent [19]

Woods

[11] 4,092,608

[45] May 30, 1978

[54] ELECTRONIC CIRCUITRY

[76] Inventor: Walter David Woods, 15469 Camarillo St., Sherman Oaks, Calif. 91403

[21] Appl. No.: 709,444

[22] Filed: Jul. 28, 1976

[51] Int. Cl.² .............................................. H03F 3/38
[52] U.S. Cl. ...................................... 330/10; 330/149; 330/199; 330/297
[58] Field of Search .......................... 330/10, 199–204, 330/207 A, 149; 331/37; 325/472

[56] References Cited

U.S. PATENT DOCUMENTS

| 2,736,774 | 2/1956 | Robinson et al. | 330/10 X |
| 2,892,944 | 6/1959 | Wu | 331/37 |
| 3,829,788 | 8/1974 | Ford | 330/10 |

FOREIGN PATENT DOCUMENTS

| 210,528 | 11/1955 | Australia | 330/10 |
| 45-29847 | 10/1967 | Japan | 330/10 |

Primary Examiner—James B. Mullins
Attorney, Agent, or Firm—Francis X. LoJacono

[57] ABSTRACT

The present application relates to electronic circuitry for the improved handling of electric signals, particularly to the amplification thereof. The present application discloses an integral-amplifier that has a much higher efficiency than corresponding prior-art circuits, and also discloses that, where so desired, intermodulation signals may be reduced to a negligible value.

29 Claims, 5 Drawing Figures

ELECTRONIC CIRCUITRY

BACKGROUND

It is well known that it is often necessary for a weak electric signal to be amplified to a corresponding strong electric signal; and, while this need arises in many fields, the present invention will be discussed primarily in terms of the needs, the problems, and some of the solutions of an "audio" system (i.e., a system for playing music for recording, for public addresses, etc.). In such systems, the weak electric signal from a musical instrument, from a microphone, from a pick-up, from a transducer, etc., is applied to an electronic "amplifier" in order to be converted to a strong electric signal; and the amplifier should be preferably small, lightweight, portable, cool-operating, noise-free, etc.

In the past, these electronic amplifiers have generally taken the form of a "linear" amplifier, the term linear amplifier indicating that the weak input signal is "linearly" amplified in such a manner that the output signal is stronger, and corresponds closely to the input signal — i.e., is not distorted by the amplifier. Prior-art amplifiers generally took forms known as Class A, Class B, Class AB, Class C, Push-Pull, and the like, specific amplifier configurations being selected because of the desired input, output, required conditions of operation, or desired results. Unfortunately, such amplifiers (and their associated "power supplies") have the disadvantage that they are relatively inefficient, their inefficiencies producing heating effects. These, in turn, required cooling facilities, such as fans — the fans introducing an additional disadvantage, in that they required additional power, and produced spurious effects such as noises and vibrations that found their way into the electric or audible output. These spurious effects are intolerable in high-quality systems, or in locations such as recording studios. Moreover, the prior-art amplifiers and power supplies usually operated in the 60 Hertz range; and their circuitry required relatively large, bulky, and heavy electronic components — these reducing portability.

OBJECTIVES AND DRAWINGS

It is the principal objective of the present invention to provide an improved electronic circuit.

It is another objective of the present invention to provide an improved electronic circuit that functions to reduce intermodulation signals.

It is still another objective of the present invention to provide an improved electronic circuit that reduces intermodulation signals by a technique designated "synchronous switching".

It is a further objective of the present invention to provide an improved integral electronic amplifier.

It is a further objective of the present invention to provide an improved integral electronic amplifier that is smaller, lighter, and operates cooler.

It is a further objective of the present invention to provide an improved integral electronic amplifier utilizing a switched-mode type of power supply.

It is a further objective of the present invention to provide an improved integral electronic amplifier utilizing a switched-mode amplifier having a first frequency generator therein, and further utilizing a switched-mode power supply having a second frequency generator therein — said frequencies preferably having an aliquot frequency relationship.

It is a still further objective of the present invention to provide an improved electronic integral amplifier having a high-frequency generator in the amplifier stage thereof, having a high-frequency generator in the power supply thereof, and having a means for providing synchronous switching between said high-frequency generators.

It is a still further objective of the present invention to provide an improved integral electronic amplifier having a switched-mode amplifier stage utilizing a first high-frequency generator, a switched-mode power supply utilizing a second high-frequency generator, and frequency converter means for providing synchronous switching of said generators.

The attainment of these objectives and others will be realized from a study of the following specification, taken in conjunction with the drawings, of which:

SYNOPSIS

Broadly stated, the present application discloses an integral amplifier comprising a switched-mode power section and a switched-mode amplifier section, both having very high efficiencies. The present application also discloses a synchronous switching circuit, connected between said switched-mode power-supply section and said switched-mode amplifier section, for causing said sections to coact in such a manner as to reduce intermodulation signals to a negligible value.

INTRODUCTION

It is recognized that the poor performance of prior-art electronic amplifiers is due, in part, to the relatively poor quality of the operating voltages obtained from their power supplies. As a result, many schemes were devised to improve the power-supply output, some of these schemes filtering the incoming 60-Hertz power, some of these schemes bypassing the various harmonics of the 60-Hertz power, some of these schemes shielding the power-supply wires, etc. Unfortunately, these schemes also tended to increase the bulk, weight, and cost of the resultant amplifier, and to decrease the power-supply's efficiency. Another scheme attempted to "regulate" (prevent fluctuations of) the output voltage from the power supply; but this scheme had its own inherent problems.

Thus, there is an ever-increasing need for an improved power-supply section and for an improved amplifier section.

THE POWER-SUPPLY SECTION

Figure 1:
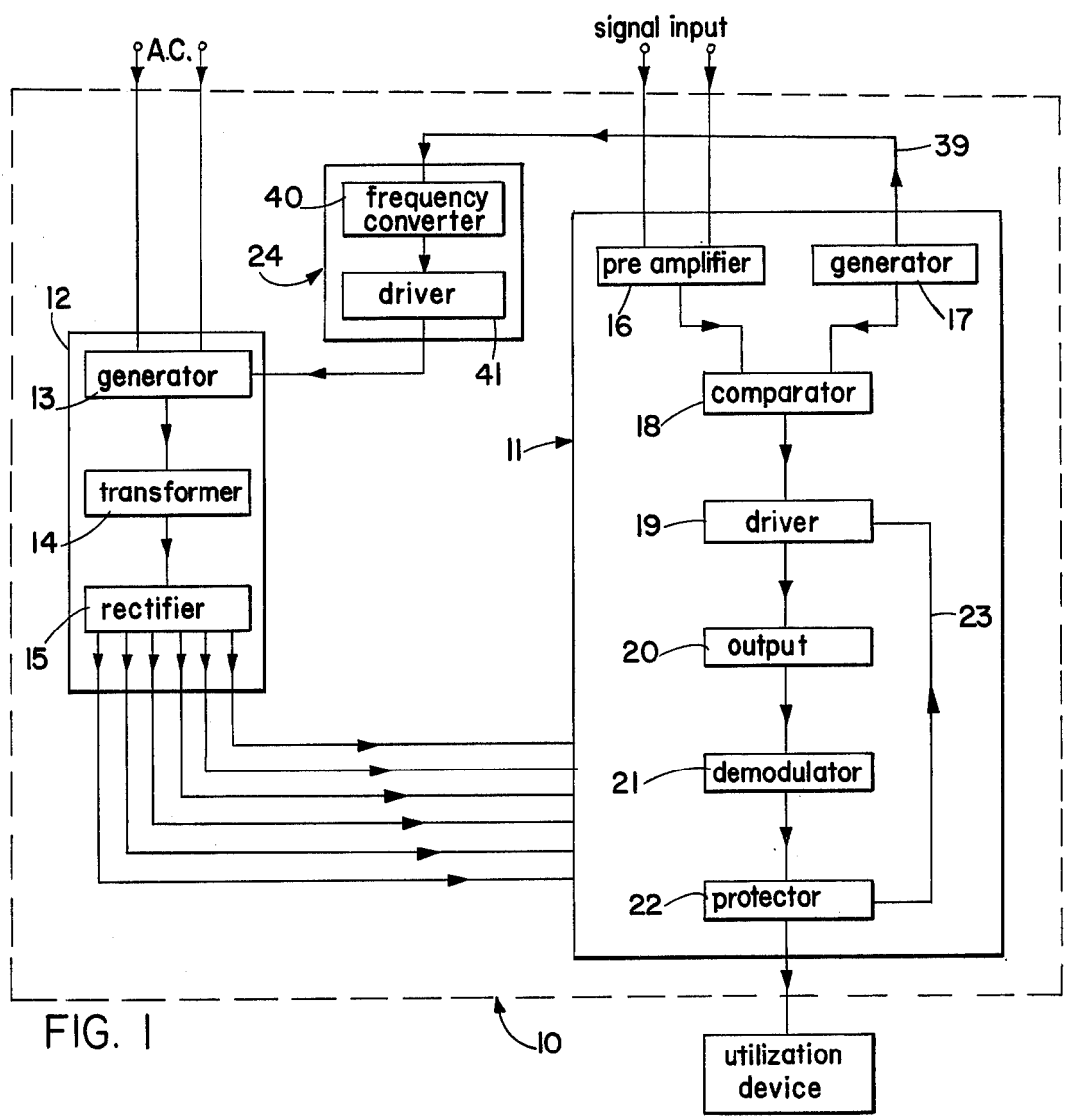
FIG. 1 shows a block diagram illustrative of one use of the present invention.

In FIG. 1, an integral electronic amplifier 10 comprises an amplifier section 11 and an associated power-supply section 12. Power-supply section 12 is indicated to obtain its operating power from an AC 60-Hertz power line — this being applied to a high-frequency generator stage 13 that eventually, in a manner to be discussed later, produces a high-frequency signal. The high-frequency output of power-supply generator stage 13 is transformed, by a transformer 14, to a higher AC voltage; and a high-frequency rectifier stage 15 is used to provide one or a plurality of various-valued DC operating voltages.

THE AMPLIFIER SECTION

FIG. 1 shows that the integral electronic amplifier 10 comprises an amplifier section 11 receiving the various output voltages from the above-described power-supply section 12. Amplifier section 11 may comprise, if desired, an input pre-amplifier stage 16 to which the input audio signals are applied and comprises a second high-frequency generator stage 17 which may take the form of an oscillator that provides a waveform known as a "carrier" signal, a "carrier frequency" and as a "carrier frequency signal".

In amplifier section 11, the carrier-frequency signal is used to constantly "sample" the output of the pre-amplifier stage 16; and — as in comparator stage 18 — to compare successive samples to determine whether the instantaneous incoming audio signal is smaller-than/equal-to/or larger-than the preceding sample of the incoming audio signal. Amplitude changes and frequency variations of the incoming audio signal are converted, by well-known techniques, to pulse-width modulations of the carrier signal — the pulse-width modulations corresponding to the results of the instantaneous comparisons.

The pulse-width-modulated waveform is applied, through a level-translator-and-driver stage 19, to an output stage 20 where the actual amplification takes place. The now-amplified, pulse-width-modulated waveform is then applied to a demodulator stage 21 that strips away the carrier signal, to recover the now-amplified input audio signal.

Since transistors should not be overloaded, amplifier section 11 comprises a protector stage 22 that is adapted to feed back — over wire 23 — a protective signal to stage 19. The amplified output signal from protector stage 22 is applied to a utilization device — such as a loudspeaker, a recorder, or the like.

THE SYNCHRONOUS SWITCHING CIRCUIT

For reasons that will be discussed later, it is desirable to have a synchronous switching circuit 24 electrically connected between amplifier section 11 and power-supply section 12.

DIGRESSION

It is well known that an electric switch is primarily used to switch between states that permit or prevent the flow of electricity. It is also well known that the power wasted by the switch may be represented by the mathematical equation "$I^2R$", wherein "I" represents the instantaneous value of the electric current, and "R" represents the instantaneous value of resistance offered by the switch to the flow of electricity. This "$I^2R$" switch power is actually lost power; because it is not available to be used elsewhere, and — moreover — causes problems such as undesired heating, switch deterioration, transient signals, etc.

Early switches were mechanical devices, these being later replaced by gases, by electron tubes, by magnetic components, by solid-state devices such as transistors, and the like.

Ideally, when a switch, of any type, has interrupted the flow of electric current, the current factor "I" has a value of zero; so that the term "$I^2R$" is equal to zero — showing that the switch does not use any power during the time interval that it permits the flow of electricity.

However, while the switch is in its transient state — that is, in the process of either interrupting or initiating the flow of electricity — neither the current factor "I" nor the resistive factor "R" is equal to zero. In fact, the value of either or both of these factors may be quite high — and varying — during the switch's transitional state; so that the "$I^2R$" term indicates that there is usually an appreciable power loss during the transient states of the switch — regardless of its type.

Most amplifiers use electron tubes, transistors, etc. in an "amplifying" mode, which means that these elements are never completely conductive, nor are ever completely non-conductive — being in a partially-conductive state to permit amplification. This partially-conductive state corresponds to the transient state of switches, as described above; so that the amplifying mode of operation produces power loss and other undesirable effects — which cause low-efficiency operation.

THE SWITCHED-MODE OPERATION

Recently developed electronic techniques introduced a type of circuit having an extremely high efficiency; but, unfortunately, this circuit has not yet received a standardized designation. At present, is it variously known as a "switched-mode circuit", as a "two-stage circuit", as a "circuit using switching techniques", etc.; and the resultant devices have been named a "two-state modulator", a "switched-power amplifier", a "switched power supply", a "class-D amplifier", a "digital amplifier", etc., etc.

For purposes of consistency, the present disclosure will be presented using the term "switching" and "switched-mode"; and these terms will be applied to the circuits and elements as required to provide the desired clarity of explanation. However, the use of these terms should be construed as being generic to the other terms given above — and to any new term that may be introduced later.

A switched-mode circuit operates on an entirely different principle than the amplifying mode circuits discussed above; the switched mode causes its transistors to act as very efficient ON/OFF switches that have minimal-duration transient states. The switched mode of operation is such that, alternately, one of its switching transistors is completely conductive, while the other switching transistor is completely non-conductive. Thus, during these alternating states, the switching transistors use only a relatively small amount of power — leading to high-efficiency circuits.

It should be noted that the switched-mode type of circuits usually operate at a high frequency; and thus their circuitry requires relatively small, compact and lightweight electric components — and, even more advantageously, these electronic components can usually form micro-miniaturized circuitry.

THE SWITCHED-MODE POWER SUPPLY

Figure 2:
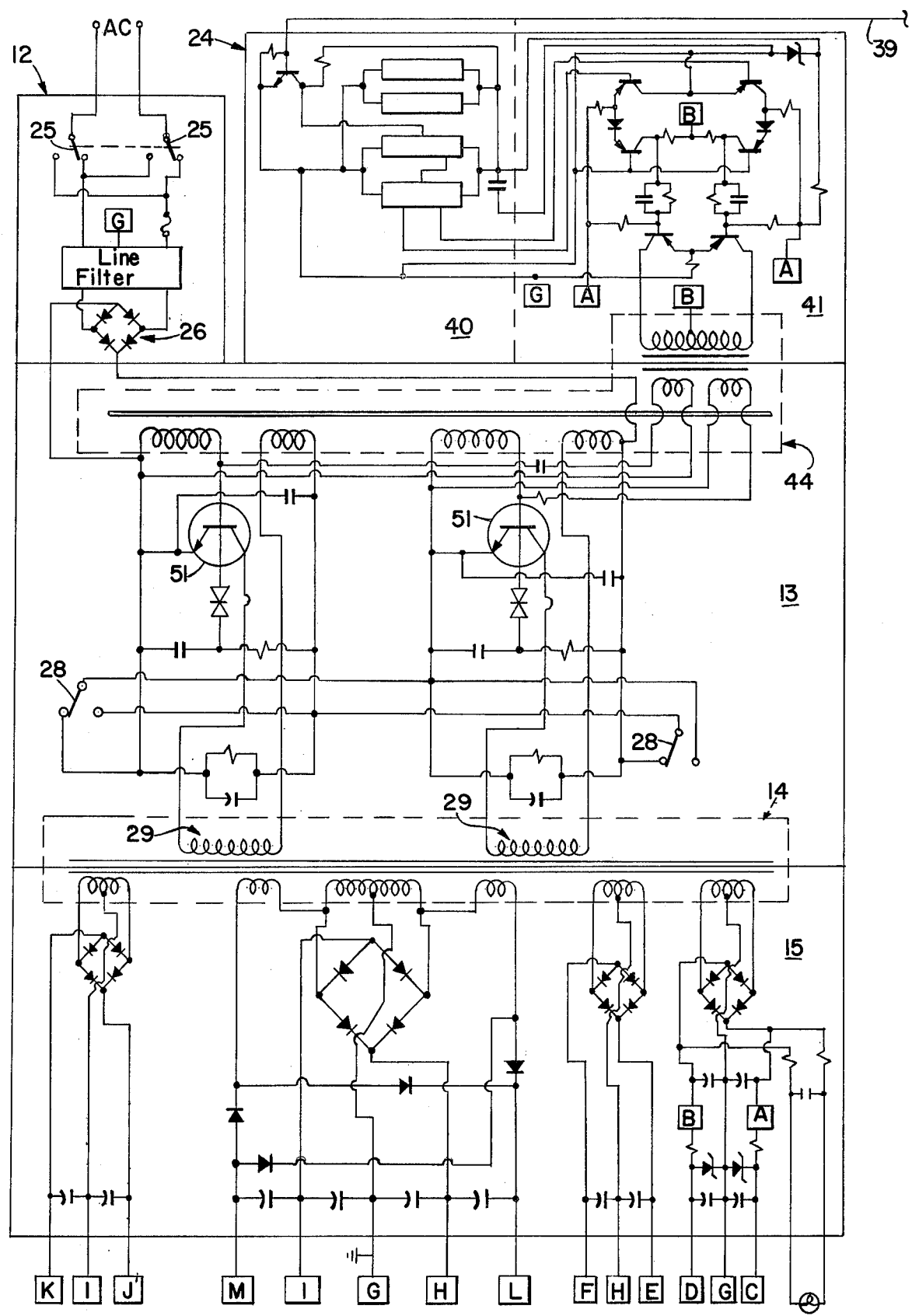
FIG. 2 shows a schematic diagram illustrative of one use of a switched-mode and a synchronous switching circuit.
Figure 3:
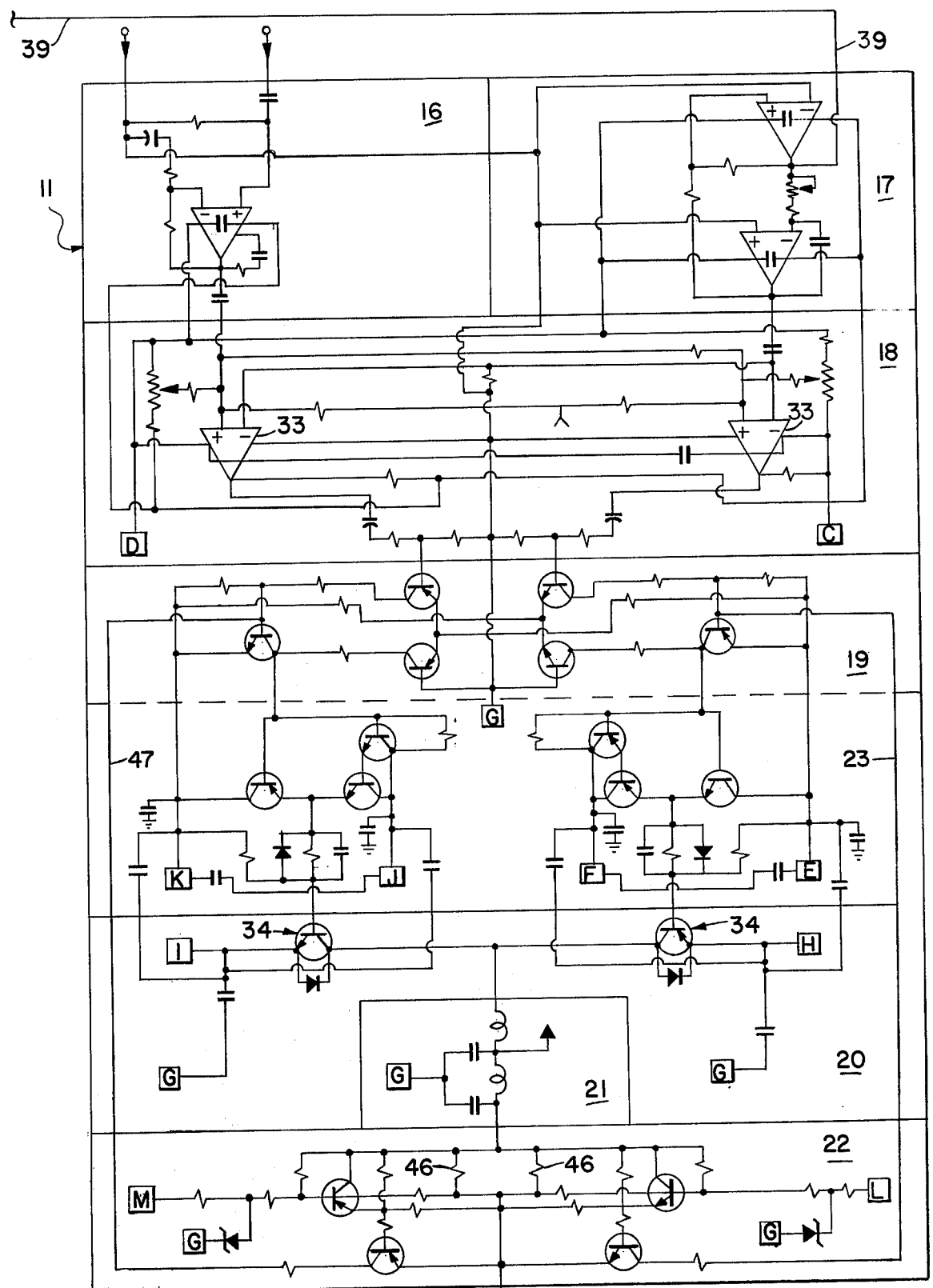
FIG. 3 shows a schematic diagram illustrative of one use of a switched-mode amplifier and a synchronous switching circuit.

FIGS. 2 and 3 show an example of a circuit for a switched-mode integral amplifier 10, the circuit being divided between the two figures for ease of illustration and explanation.

FIG. 2 shows a representative switched-mode power-supply section 12 for use in the disclosed integral amplifier 10. Here, the input power is obtained from a 60-Hertz AC power line, a ganged double-pole, double-throw reversing switch 25 being provided for minimizing hum. It has been found desirable to use a line filter for filtering out signals that are inadvertently picked up by the AC power line.

A full-wave bridge rectifier 26 provides DC power to the high-frequency generator 13 discussed above; and this power-supply high-frequency generator 13 functions as a switched-mode power stage that may take the form of any one of a number of available oscillator circuits. The power-supply generator 13 is designed to operate at a frequency in the range of 20-40 Kilohertz for reasons to be discussed later, the output of generator 13 preferably comprising a train of square or rectangular pulses.

A second double-pole, double-throw ganged switch 28 connects the windings 29 in either a series or a parallel electrical configuration; so that the output of the power supply 12 is adapted for either 120 volt or 240 volt inputs.

The output of the high-frequency generator 13 is applied, through transformer 14, to the high-frequency rectifier stage 15 — as discussed above, the rectifier stage 15 producing a plurality of different DC output voltages, as indicated by the lettered blocks. If desired, one or more suitable AC or DC voltages may be provided for other purposes, such as pilot lights and the like. These DC output voltages from the rectifier stage 15 are used as the operating voltages for the amplifier section 11, to be described later.

The switched-mode power-supply section 12 of FIG. 2 operates as follows. When AC power is applied, rectifier 26 provides operating power for the high-frequency switched-mode generator stage 13. The circuitry brings the generator 13 into full operation; and the high-frequency rectifier stage 15 then produces the desired DC operating voltages. In this way, a high-efficiency switched-mode power supply is produced.

It should be noted that a very small amount of the high-frequency signal energy traverses rectifier stage 15; and thus appears as a "ripple" on the output DC voltages.

THE SWITCHED-MODE AMPLIFIER

FIG. 3 shows a representative switched-mode amplifier section 11 for use in the disclosed integral amplifier 10. Here, operating power is obtained from the previously described switched-mode power-supply section 12, the operating voltages being applied as indicated by the lettered blocks.

The weak electric signals to be amplified are applied to the input terminals of pre-amplifier stage 16, the output signals from the pre-amplifier stage 16 being applied to a comparator stage 18. Comparator stage 18 also receives the output signals from high-frequency generator 17 of amplifier section 11, the output of generator 17 preferably comprising a train of triangular pulses for use by the subsequent circuitry of amplifier section 11.

It should be noted that the comparator stage 18, and subsequent stages to be discussed later, are complementary; that is, each of these stages has "mirrored" circuitry for separately handling the positive-going and the negative-going signals passing therethrough. For convenience of explanation, only one side of these stages will be discussed.

In the comparator stage 18, the output of the high-frequency generator 17 and of the pre-amplifier stage 16 are both applied to a comparator circuit which may comprise an operational amplifier 33. Since the generator 17 has a constant output, the comparator stage 18 compares the value of the instantaneous signal from the pre-amplifier stage 16 with the value of the previous signal from the pre-amplifier 16. The differential-input comparator 33 thus samples the incoming audio signal at a rate established by the frequency of the carrier-frequency signal from high-frequency generator 17. Well-known techniques produce corresponding pulse-width modulations of the carrier-frequency signal. In this way, incremental changes of the incoming signal applied to the pre-amplifier stage 16 are converted to pulse-width modulations of the carrier-frequency signal.

The pulse-width-modulated waveform from comparator stage 18 is applied to a combination level-translator-and-driver stage 19. Here, the first portion of stage 19 "translates" the comparator signals from a ground reference-level to a level that is referenced to the voltages from the power-supply section 12; and the drive portion of stage 19 provides the drive for the output stage 20.

The pulse-width-modulated waveform is then amplified in output stage 20, the actual power amplification being performed by transistors 34.

The output stage 20 of amplifier section 11, as shown in FIG. 3, operates in the switched-mode manner, the switching of transistors 34 being controlled by the carrier frequency contained in the pulse-width-modulated waveform. In this way, high-efficiency switched-mode amplification is produced.

The now-amplified pulse-width-modulated waveform is applied to a demodulator 21. This may be formed — for example — of standard inductive and capacitive elements that co-act to form a low-pass filter that demodulates the pulse-width-modulated waveform by stripping off the high-frequency and passing the amplified audio frequencies. Alternatively, the demodulator stage 21 may use a band-pass filter following the low-pass filter.

THE PROTECTOR STAGE

The output of demodulator stage 21 is applied to a protector stage 22, wherein the output signals traverse sensing resistors 46 that — in case of short circuits or overloads — apply a protective signal over wire 23 to a suitable preceding stage, such as the level-translator-and-driver stage 19, in order to restrict the capability of the selected stage. Under normal operating conditions, the output of amplifier section 11 of the integral amplifier 10 is applied to a utilization device.

For technical reasons associated with switched-mode circuitry, generator 13 of power-supply section 12 provides a square or a rectangular train-like waveform for its subsequent circuits; whereas generator 17 of amplifier section 11 provides a train-like waveform for its subsequent circuitry.

In this way, the disclosed combination of a switched-mode power-supply section and a switched-mode amplifier section co-act to provide an extremely efficient integral amplifier.

INTERMODULATION SIGNALS

It is well known that, if two electric signals are "mixed", the resultant signal is a composite that invariably contains — in addition to the two original signals — a large number of new signals having a wide spectrum of different frequencies. These new signals are called "intermodulation signals". In some circuits, intermodulation signals are intentionally produced in order to obtain signals of previously unavailable frequencies; but, in most circuits, intermodulation signals are undesirable.

It was shown above that an improved, compact, high-power, efficient integral amplifier may be produced by utilizing a switched-mode amplifier (11) and a switched-mode power supply (12). However, the carrier signal of amplifier section 11 may be considered to be a first mixing signal; and the ripple energy on the voltages obtained from the power-supply section 13 may be considered to be a second mixing signal. These mixing signals co-act to produce intermodulation signals. The variety of these intermodulation signals tends to resemble a "grey-noise" signal — whose result is somewhat similar to the hiss received when a television station leaves the air.

This grey-noise hiss has an extremely small volume, and may be readily tolerated in most cases; but, for certain users (skilled musicians, etc.) and certain uses (amplification of bass tones, etc.), it is preferable that the hiss be reduced to a negligible value. The reduction of the intermodulation signals and their resulting hiss may be achieved as follows.

THE SYNCHRONOUS SWITCHING CIRCUIT

It has been found — although the reasons are not completely understood — that the intermodulation signals may be reduced to a negligible value by a technique that will be called "synchronous switching".

FIGS. 1, 2 and 3 show a synchronous switching circuit 24 electrically connected between amplifier section 11 and power-supply section 12, a portion of the train-like carrier signal from generator 17 of amplifier section 11 being transmitted over wire 39 to the synchronous switching circuit 24.

As indicated in FIGS. 1 and 2, the synchronous switching circuit 24 may take the form of a frequency converter stage 40 (comprising, for example, a plurality of flip-flop circuits) and a driver stage 41. The flip-flop circuits — because of their well-known binary characteristics — are adapted to divide the incoming signal frequency by a selected multiple of the number two; so that the frequency conversion factor may be a divider such as two, four, eight, 16, 32, etc. Other frequency-conversion factors will be discussed later. The signal transmitted to the flip-flop circuits is preferably a square or a rectangular waveform, these waveforms being optimal for activating the flip-flop circuits of the frequency converter stage 40.

The operation of the synchronous switching circuit 24 is as follows. Signals, of the carrier frequency, are applied over wire 39 from generator 17 to the synchronous switching circuit 24 — which changes the frequency in a manner established by the frequency-conversion factor — to produce a train-type switching signal of a different frequency. This switching signal is then applied — through transformer 44 of FIG. 2 — to a generator 13 of the power-supply section 12, where they control the switching rate, or frequency, of generator 13.

These switching signals do not necessarily have to be of the same frequency as the switching rate of the generator 13; that is, the switching signal may have a frequency that is a multiple or a sub-multiple of the generator 13 switching rate—such a frequency of the switching signal being designated as "compatible" with the frequency of the recipient generator (generator 13 in this illustration).

In this way, circuit 24 switches generator 13 of the power-supply section 12, in accordance with signals from generator 17 of the amplifier section 11. Stated in another way, it may be said that the generators 13 and 17 are synchronously switched, or are locked together in a no-relative-drift relationship—this relationship having the advantage that the generators do not have to be of the ultra-stable type.

FREQUENCY CONSIDERATIONS—POWER-SUPPLY SECTION

For frequencies below 20 Kilohertz, the transformer core tends to be undesirably large—because transformer size varies inversely with frequency. Also, for frequencies below 20 Kilohertz, the transformer noise tends to become audible. On the other hand, for frequencies above 40 Kilohertz, transformer and transistor power losses tend to become undesirably high—resulting in lower efficiencies and increased heating.

Thus, frequencies for the power-supply generator 13 tend to be in the 20–40 Kilohertz range.

FREQUENCY CONSIDERATIONS—AMPLIFIER SECTION

The carrier frequency should preferably be at least ten times as high as the highest frequency of the input range that is to be amplified. Thus, if the desired input were an audio range of 20–20,000 Hertz, the carrier frequency generated by the amplifier generator stage 17 should be about 200 Kilohertz (10 ×20,000= 200,000 = 200 KH). For a lower-frequency input range—say 10–2,000 Hertz—the carrier frequency should be about 20,000 Hertz (10 ×2,000 = 20,000). For a higher-frequency input range—say 20–40,000 Hertz—the carrier frequency should be 400 Kilohertz (10 ×40,000 = 400,000 = 400 KH).

Among the advantages of using a high carrier frequency are that it is easier to sample the incoming signals, and that it is easier to demodulate the pulse-width-modulated waveform. For these, and other, reasons the amplifier generator 17 should operate in the 20–1,000 Kilohertz range; whereas the power-supply generator 13 should operate in the 20–40 Kilohertz range.

REPRESENTATIVE NUMERICAL VALUES

If the amplifier generator 17 were designed to operate at 100 Kilohertz, the synchronous switching circuit 24 would be designed to have a conversion factor of four; the switching signal would then have a frequency of 25 Kilohertz (100,000 ÷ 4 = 25,000 = 25 KH); and the power-supply generator 13 would be designed to operate at 25 1 Kilohertz. Thus, each of the generators 13 and 17 would operate in its optimal range; and the switching-signal frequency would be compatible (equal, in this case) with the generator 13 frequency.

Similarly, if the amplifier generator 17 were designed to operate at 200 Kilohertz, the synchronous switching circuit 24 would be designed to have a conversion factor of eight; the switching signal would then have a frequency of 25 Kilohertz (200,000 ÷ 8 = 25,000 = 25 KH), and the power-supply generator 13 would be designed to operate at 25 Kilohertz. Thus, each of the generators 13 and 17 would operate in its optimal range;

and the switching-signal frequency would be compatible (equal, in this case) with the generator 13 frequency.

In a like manner, if the amplifier generator 17 were designed to operate at 320 Kilohertz, the synchronous switching circuit 24 could be designed to have a conversion factor of eight; the switching signal would then have a frequency of 40 Kilohertz (320,000 ÷ 8 = 40,000 = 40 KH); and the power-supply generator 13 would be designed to operate at 40 Kilohertz. Thus, each of the generators 13 and 17 would operate in its optimal range; and the switching signal frequency would be compatible (equal, in this case) with the generator 13 frequency.

Alternatively, in the latter case, the synchronous switching circuit 24 could be designed to have a conversion factor of sixteen; whereupon the switching signal frequency would have a frequency of 20 Kilohertz (320,00 ÷ 16 = 20,000 = 20 KH); and the power-supply generator 13 would be designed to operate at 20 Kilohertz. Here, too, each of the generators 13 and 17 would operate in its optimal range; and the switching signal frequency would be compatible (equal, in this case) with the generator 13 frequency.

In each of the above cases, the synchronous switching circuit 24 could be designed to produce a switching signal having a frequency that is half, twice, thrice, etc., the frequency—these switching frequencies still being compatible (although not equal) with the generator 13 frequency.

Figure 4:
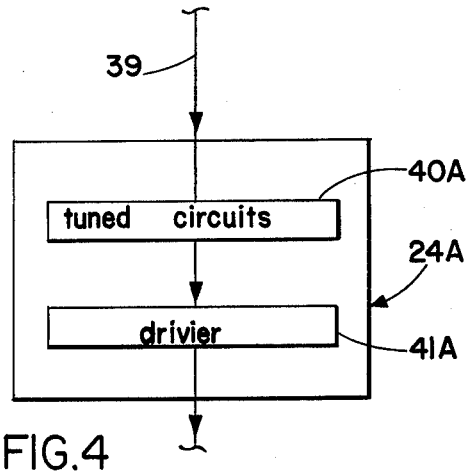
FIG. 4 shows a first alternative synchronous switching circuit.

While the above aliquot frequency relationships are technically preferable—because of the characteristics of the flip-flop circuits used in frequency converter 40—other types of frequency converters (e.g., tuned circuits of FIG. 4, etc.) are not restricted to conversion factors that are selected multiples of the number two; and with the use of such other frequency converters, integer conversion factors (1, 3, 5, 6, 7, etc.) are feasible. In fact, the conversion factor may be a fractional or a mixed number in order to produce a switching signal of a frequency that is compatible with the generator 13 frequency.

Contrariwise, still other frequency relationships may be utilized by having frequency converter 40 take the form of a frequency multiplier—to perform frequency multiplication, rather than frequency division; and, in some cases, it may be desirable to apply the resultant switching signals from generator 13 to recipient generator 17.

It appears that the input range should be about 20-20,000 Hertz for vocal tones; and should be about 20-12,000 Hertz for public address systems. However, some musicians feel that the desired input range should be extended to about 10-100,000 Hertz for high-quality music—this requiring a carrier frequency of 1,000 which is in the range discussed above. On the other hand, the audio range need by only about 20-2,000 Hertz for bass notes—this requiring a carrier frequency of only 20 Kilohertz, which is also in the range discussed above.

Figure 5:
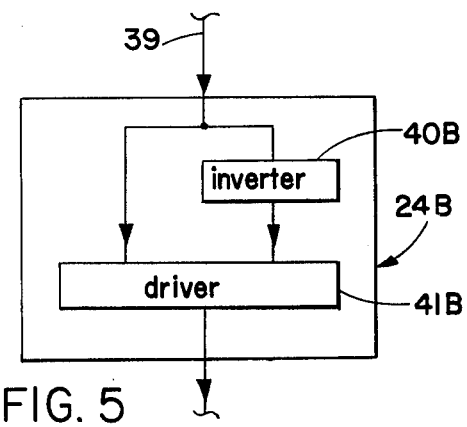
FIG. 5 shows a second alternative synchronous switching circuit.

In the latter case, a 20 Kilohertz amplifier generator 17 would have to switch a 20 Kilohertz power-supply generator 17; and this 20:20 frequency relationship would require a conversion factor of one (unity)—which, unfortunately, is not readily available from a flip-flop circuit. However, a synchonous switching circuit such as indicated in FIG. 5 may be used as a unity-value circuit—it may also function as an interfacing circuit when such is needed. Alternatively, the above-mentioned frequency multiplication concept may be used, a unity-gain amplifier stage providing a unity conversion factor, and serving as an interfacing circuit.

In this way, the synchronous switching circuit 24 maintains a synchronous switching relationship between the switched-mode amplifier section 11 and the switched-mode power-supply section 12 of the disclosed integral amplifier, thus reducing intermodulation signals to a negligible value.

OPERATION

When the AC power is first applied to the power-supply section (see FIG. 2.), the voltage produced by the full wave rectifier 26 permits the power-supply generator 13 to go into an initiating oscillation in the 100-10,000 Hertz range; and this causes transformer 14 to produce a phenomenon known as "ringing". This, in turn, causes the power-supply rectifier stage 15 to produce preliminary output voltages. These preliminary voltages are applied to amplifier section 11 (see FIG. 3.) as indicated, causing the amplifier section circuits to go into preliminary states of operation. The preliminary-state operation of the amplifier generator 17 applies a signal through wire 39 to the synchronous switching circuit 24 (see FIG. 2.). The resultant switching signals traverse transformer 44, and are applied to the power-supply generator 13—which thereupon produces stronger output voltages. This progressive regenerative feedback causes the power-supply generator 13 to eventually reach its design power and switching rate—as established by switching transistors 51. Similarly, the circuits of integral amplifier 10 eventually reach their fully-operative states.

ADVANTAGES

The disclosed electronic circuitry has innumerable advantages over prior-art corresponding circuits.

First of all, it is extremely efficient.

Second, it is much smaller than prior-art corresponding circuits.

Third, it is much lighter in weight than prior-art corresponding circuits.

Fourth, it is much more portable than prior-art corresponding circuits.

Fifth, it operates much cooler than prior-art corresponding circuits.

Sixth, it does not require a cooling fan.

Seventh, it has much better amplification characteristics.

Eighth, it requires less power than prior-art corresponding circuits.

Ninth, it may cover any desired frequency range.

Finally, it is capable of reducing intermodulation signals to a negligible value.

I claim:

1. The invention comprising:
   first signal-generating means for generating a first signal having a first frequency;
   second signal-generating means for generating a second signal having a second frequency;
   means, comprising a synchronous-switching circuit electrically connected between said first signal-generating means and said second signal-generating means for inhibiting the production of undesirable signals normally produced by the interaction of the said first and said second signals;
   said inhibiting means comprising means for applying a signal from one of said signal-generating means to the input of said synchronous-switching circuit;

means for causing said synchronous-switching circuit to produce a switching signal having a frequency that is compatible with the frequency of said other signal-generating means;

means for applying said switching signals from the output of said synchronous-switching circuit to the input of said other signal-generating means.

2. The invention of claim 1, wherein said first frequency and said second frequency have an aliquot relationship.

3. The invention of claim 1, wherein said synchronous switching circuit is adapted to provide a frequency-conversion factor having an integer-number characteristic.

4. The invention of claim 1, wherein said synchronous switching circuit is adapted to provide a frequency-conversion factor having a binary characteristic.

5. The invention of claim 1, wherein said synchronous switching circuit is adapted to provide a frequency-conversion factor having a fractional-number characteristic.

6. The invention of claim 1, wherein said synchronous switching circuit is adapted to provide a frequency-conversion factor having a mixed-number characteristic.

7. The invention of claim 1, wherein said synchronous switching circuit is adapted to provide a unity frequency-conversion factor.

8. The invention of claim 1, wherein said synchronous switching circuit is a frequency divider.

9. The invention of claim 1, wherein said synchronous switching circuit is a frequency multiplier.

10. The invention of claim 1, wherein said synchronous switching circuit is a tuned circuit.

11. An electron circuit comprising:
at least one section having a first oscillator means for generating a first signal having a first fixed frequency;
at least one section having second oscillator means for generating a second signal having a second fixed frequency;
means for electrically interconnecting said sections of said electron circuit;
means, comprising a synchronous-switching circuit electrically connected between said first oscillator means and said second oscillator means, for inhibiting the production of undesirable signals normally produced by the interaction of said first and said second signals;
said synchronous-switching circuit comprising frequency converting means for converting said first signal to a switching signal;
means for applying said first signal from first oscillator means to said synchronous-switching circuit;
means for applying said switching signal from said synchronous switching circuit to said second oscillator means.

12. The invention of claim 11, wherein one of said sections is a power-supply section.

13. The invention of claim 11, wherein one of said sections is an amplifying section.

14. The invention of claim 11, wherein said sections are of the switched-mode type.

15. The invention of claim 11, wherein
the frequency of said first signal is higher than the frequency of said second signal;
said synchronous switching circuit comprises a frequency divider.

16. The invention of claim 11, wherein said synchronous switching circuit provides switching signals having a frequency that is compatible with the frequency of said second signal-generating means.

17. An integral amplifier comprising:
a switched-mode amplifier section having first oscillator means for generating a first signal having a first fixed frequency;
a switched-mode power-supply section having second oscillator means for generating a second signal having a second fixed frequency;
means for applying at least one output of said switched-mode power-supply section to said switched-mode amplifier section as at least one operating voltage thereof.

18. The invention of claim 17, wherein said first frequency is in the 20–1,000 Kilohertz range, and said second frequency is in the 20–40 Kilohertz range.

19. The invention of claim 17 including means, comprising a synchronous switching circuit electrically connected between said first oscillator means, for inhibiting the production of the undesirable signals normally resulting from the coaction of said first signal and said second signal.

20. The invention of claim 19, including:
means for applying said first signal from said first oscillator means to said synchronous-switching circuit;
means for causing said synchronous-switching circuit to convert said first signal to a switching signal having a frequency that is compatible with said second oscillator means;
means for applying said switching signal from said synchronous switching circuit to said second oscillator means.

21. The invention of claim 19, wherein said synchronous switching circuit is adapted to provide a frequency-conversion factor of an integer number.

22. The invention of claim 19, wherein said synchronous switching circuit is adapted to provide a frequency conversion factor having a binary characteristic.

23. The invention of claim 19, wherein said synchronous switching circuit is adapted to provide a frequency conversion factor that is a fractional number.

24. The invention of claim 19, wherein said synchronous switching circuit is adapted to provide a frequency conversion factor that is a mixed number.

25. The invention of claim 19, wherein said synchronous switching circuit is adapted to provide a unity frequency conversion factor.

26. The invention of claim 19, wherein said synchronous switching circuit is a frequency divider.

27. The invention of claim 19, wherein said synchronous switching circuit is a frequency multiplier.

28. The invention of claim 19, wherein said synchronous switching circuit is a tuned circuit.

29. The invention of claim 17, wherein said first frequency and said second frequency have an aliquot relationship.

* * * * *